US011245403B2

(12) United States Patent
Sievert et al.

(10) Patent No.: US 11,245,403 B2
(45) Date of Patent: Feb. 8, 2022

(54) METHOD AND A SYSTEM FOR CALIBRATING A PHASE NONLINEARITY OF A DIGITAL-TO-TIME CONVERTER

(71) Applicant: INTEL IP CORPORATION, Santa Clara, CA (US)

(72) Inventors: Sebastian Sievert, Munich (DE); Ofir Degani, Nes-Ammin (IL); Ashoke Ravi, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 29 days.

(21) Appl. No.: 16/618,427

(22) PCT Filed: Jul. 17, 2017

(86) PCT No.: PCT/US2017/042306
§ 371 (c)(1),
(2) Date: Dec. 2, 2019

(87) PCT Pub. No.: WO2019/017864
PCT Pub. Date: Jan. 24, 2019

(65) Prior Publication Data
US 2021/0143823 A1    May 13, 2021

(51) Int. Cl.
*H03M 1/10*    (2006.01)
*H03L 7/085*    (2006.01)
*G04F 10/00*    (2006.01)

(52) U.S. Cl.
CPC ............ *H03L 7/085* (2013.01); *G04F 10/005* (2013.01); *H03M 1/1009* (2013.01); *H03M 1/1071* (2013.01)

(58) Field of Classification Search
CPC ... H03L 7/085; H03M 1/1009; H03M 1/1071; G04F 10/005
USPC .......................................... 341/120, 118, 144
See application file for complete search history.

(56) References Cited

U.S. PATENT DOCUMENTS

| 6,934,341 B2* | 8/2005 | Sahlman | H03F 1/3229 330/151 |
| 7,940,099 B2* | 5/2011 | Weltin-Wu | H03L 7/0991 327/159 |
| 9,362,936 B1* | 6/2016 | Caffee | H03K 5/135 |
| 9,698,807 B1* | 7/2017 | Caffee | H03M 1/1033 |
| 10,298,243 B2* | 5/2019 | Mayer | H03L 7/091 |
| 2002/0048326 A1* | 4/2002 | Sahlman | H03F 1/3229 375/297 |
| 2008/0005213 A1* | 1/2008 | Holtzman | G06F 1/0335 708/276 |

(Continued)

*Primary Examiner* — Jean B Jeanglaude
(74) *Attorney, Agent, or Firm* — 2SPL Patent Attorneys PartG mbB; Yong Beom Hwang

(57) ABSTRACT

A method for calibrating a phase nonlinearity of a digital-to-time converter is provided. The method includes generating, based on a control word, a reference signal using a phase-locked loop. A frequency of the reference signal is equal to a frequency of an output signal of the digital-to-time converter. Further, the method includes measuring a temporal order of a transition of the output signal from a first signal level to a second signal level, and a transition of the reference signal from the first signal level to the second signal level. The method additionally includes adjusting a first entry of a look-up table based on the measured temporal order.

25 Claims, 4 Drawing Sheets

(56) References Cited

U.S. PATENT DOCUMENTS

| | | |
|---|---|---|
| 2010/0141316 A1* | 6/2010 | Weltin-Wu ........... H03L 7/0991 327/159 |
| 2010/0164561 A1* | 7/2010 | Roberg ................. H03L 7/087 327/117 |
| 2015/0188583 A1 | 7/2015 | Ravi et al. |
| 2015/0280842 A1 | 10/2015 | Mayer et al. |
| 2016/0173118 A1 | 6/2016 | Mayer et al. |
| 2016/0373120 A1* | 12/2016 | Caffee ................. H03L 7/0814 |
| 2017/0085365 A1 | 3/2017 | Ravi et al. |
| 2018/0131380 A1* | 5/2018 | Mayer .................... H03L 7/091 |

* cited by examiner

METHOD AND A SYSTEM FOR CALIBRATING A PHASE NONLINEARITY OF A DIGITAL-TO-TIME CONVERTER

FIELD

The present disclosure relates to correcting phase nonlinearities of Digital-to-Time Converters (DTC). In particular, the present disclosure relates to a method and a system for calibrating a phase nonlinearity of a DTC.

BACKGROUND

DTCs are used for generating fractional shifted frequencies or modulated signals from a constant reference frequency. They may be used, e.g., for carrier frequency shift and phase modulation in digital polar transmitters (DPTX), for frequency synthesis in receivers (RX), or for digital clock generation in clocking applications.

Some applications (e.g. digital clock generation) have relaxed specifications, i.e. they are tolerant against DTC phase nonlinearity. Especially applications for DPTX and RX require highly linear DTCs. As no attractive or competitive architecture for an ideally linear DTC is known, the DTC nonlinearity is calibrated on-chip and the digital DTC data is pre-distorted with the information from the DTC calibration.

Several calibration engines have been proposed and implemented. Their major drawback is the calibration of a specific DTC operation case (e.g. calibration of quasi-static DTC programming, or calibration of a particular code ramp).

However, the DTC nonlinearity changes for different operation types (e.g. different code ramps or modulation), so that one set of calibration data is not sufficient for all operation types.

Hence, there may be a desire for improved calibration of DTC nonlinearities.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
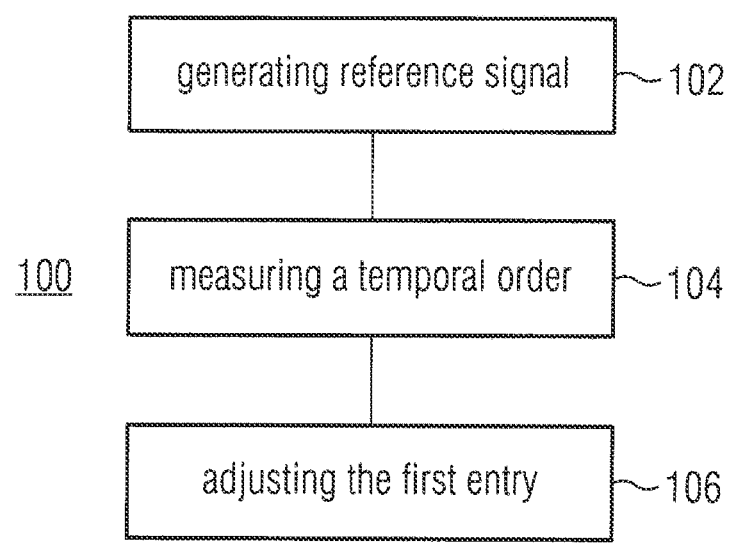
FIG. 1 illustrates a flowchart of an example of a method for calibrating a phase nonlinearity of a DTC.

FIG. 1 illustrates a flowchart of a method 100 for calibrating a phase nonlinearity of a DTC. The method 100 comprises generating 102, based on a control word, a reference signal using a Phase-Locked Loop (PLL). A frequency of the reference signal is (substantially) equal to a frequency of an output signal of the DTC. Further, the method 100 comprises measuring 104 a temporal order of a transition of the output signal from a first signal level to a second signal level, and a transition of the reference signal from the first signal level to the second signal level. The method 100 additionally comprises adjusting 106 a first entry of a Look-Up Table (LUT) based on the measured temporal order.

The DTC may generate the output signal based on the first entry of the LUT. The first entry is assigned to a first control code for the DTC which is based on a control word for controlling a frequency of the output signal.

The method 100 may allow to compensate for DTC phase nonlinearity by adjusting the first entry in the LUT (assigned to the first code word) based on the temporal order of the DTC output signal and the reference signal. Since the method 100 does not depend on the specific time difference between the output signal and the reference signal, but merely on the temporal order, a detector with comparatively low resolution may be used for measuring 104 the temporal order of the output signal and the reference signal. Furthermore, the programming of the DTC does not need to be changed during calibration. Accordingly, a background calibration may be performed. That is, the DTC may be operated regularly during calibration so that a down-time of a device incorporating the DTC may be avoided. For example, after a temperature change the DTC nonlinearity may change. In order to compensate for the temperature dependent change of DTC nonlinearity, a background calibration according to method 100 may be performed.

The DTC may, e.g., receive an oscillating input signal. Based on the control word, a frequency and/or a phase shift of the output signal with respect to the oscillating input signal may be adjusted. For example, if the DTC is used in a receiver, the output signal may be supplied to a mixing circuit using the output signal to down-convert a radio frequency receive signal. That is, the method 100 may further allow to calibrate the specific nonlinearity of each generated RX carrier (including both static and dynamic DTC nonlinearity).

The first signal level of a signal is a level that is related to a first logic state, whereas the second signal level of a signal is a level that is related to a different second logic state. That is, a signal indicates the first logic state if it is at the first signal level, whereas the signal indicates the second logic state if the signal is at the second signal level. For example, the first signal level may indicate "1" or "high" and the second signal level may indicate "0" or "low", and vice versa. The signal level may, e.g., be a voltage of the signal. In some examples, the transition from the first signal level to the second signal level may be a falling signal edge. In other examples, the transition from the first signal level to the second signal level may be a rising signal edge.

The temporal order indicates which of the output signal and the reference signal switches first from the first signal level to the second signal level. For example, a Bang-Bang Phase Detector (BBPD) may be used for measuring 104 the temporal order. The output signal (i.e. the DTC output) switches either earlier or later than the reference signal depending on the DTC nonlinearity for a specific control code. Since the method 100 (which may be understood as a calibration engine) does not depend on the measurement of the specific time difference between both signals, a BBPD may be used. Using a Time-to-Digital Converter (TDC) may be avoided since the higher time resolution of the TDC is not needed. Accordingly, TDC nonlinearity as complexity may be avoided in the calibration engine. However, in some examples, also a TDC may be used for measuring 104 the temporal order.

The first control code for the DTC may be part of a continuously rising or falling code sequence (code ramp) generated based on the control word. For example, the first and further control codes may be generated by continuously integrating the control word. Accordingly, a number of continuously rising or falling control codes for the DTC may be generated.

The LUT may comprise an entry for each control code. For example, for N control codes for the DTC, the LUT may comprise N entries, wherein each of the N entries is assigned to a specific one of the N control codes for the DTC. The LUT may be initially filled with arbitrary date (e.g. zeros, data from a previous calibration, random data). The entries in the LUT may be understood as the result of a predistortion of the control codes for the DTC in order to compensate for the DTC nonlinearity. That is, an entry in the LUT is an adjusted control code for the DTC, which is derived from the control code to which it is assigned. By adjusting one of the entries in the LUT, the nonlinearity of the DTC for the specific code may be calibrated. For example, the entry in the LUT may be incremented or decremented based on the temporal order of the output signal and the reference signal.

Before the first entry in the LUT is calibrated, the reference signal and the output signal may be aligned. Therefore, the method 100 may additionally comprise adjusting a phase of the reference signal to be (substantially) equal to a phase of the output signal generated by the DTC based on a second entry in the LUT. The second entry is assigned to a second control code for the DTC for which the DTC is phase linear. The DTC does not exhibit phase nonlinearity for all control codes. For one or more control codes of the code sequence, the DTC is per definition phase linear. These control codes may be used to align the reference signal to the output signal.

In addition to the control word, generating 102 the reference signal may be further based on a frequency control word. Adjusting the phase of the reference signal may then further comprise measuring, for the second entry, a time shift between a transition of the output signal from the first signal level to the second signal level, and a transition of the reference signal from the first signal level to the second signal level. Alternatively, adjusting the phase of the reference signal may further comprise measuring, for the second entry, a third temporal order of a transition of the output signal from the first signal level to the second signal level, and the transition of the reference signal from the first signal level to the second signal level. Further, adjusting the phase of the reference signal may comprise generating the frequency control word based on the time shift or the third temporal order. Accordingly, the phase of the reference signal may be adjusted to be equal to the phase of the output signal generated by the DTC based on the second entry in the LUT by adjusting the frequency control word. In other words, the reference signal is adjusted such that it does not exhibit a phase shift to the output signal of the DTC, wherein the output signal of the DTC is generated based on a code word for which the DTC is phase linear.

For example, adjusting the frequency control word may comprise calculating, based on the time shift or the third temporal order, a phase error of the reference signal with respect to the output signal. Further, adjusting the frequency control word may comprise adjusting the frequency control word based on the phase error.

The time shift between or the third temporal order of the reference signal and the output signal for the second entry in the LUT may be measured by the same or different circuitry than the temporal order of the reference signal and the output signal for the first entry in the LUT. For example, the time shift between reference signal and the output signal for the second entry in the LUT may be measured using a TDC, and the third temporal order of the reference signal and the output signal for the second entry in the LUT may be measured using a BBPD.

Alternatively, the output signal of the DTC may be calibrated to the reference signal. Then, the method 100 may further comprise measuring a phase error of the reference signal with respect to a phase of the output signal generated by the DTC based on the second entry in the LUT. Further, the method 100 may comprise generating a correction code based on the phase offset, wherein the first control code is further based on the correction code. That is, the control codes of the code sequence may be adjusted based on the correction code. For example, the control codes of the code sequence may be incremented or decremented by the correction code in order to adjust the phase of the DTC output signal to the phase of the reference signal. Accordingly, a phase of the DTC output signal for code words of the code sequence for which the DTC is phase linear may be equal to the phase of the reference signal.

The above measuring of the temporal order for calibrating the first entry in the LUT may be carried out a predetermined number of times so that a predetermined number of temporal orders is measured. Accordingly, adjusting the first entry may be based on the predetermined number of temporal orders. For example, if a BBPD is used for measuring the temporal order, and a PLL with comparatively high jitter is used for generating the reference signal, the measured temporal orders may be averaged in order to achieve a high calibration accuracy. For example, the temporal order may be measured 16 times or more, 64 times or more, 256 times or more, 1024 times or more, or 4096 times or more. In some examples, at least part of the predetermined number of temporal orders may be measured in parallel. Accordingly, a calibration time may be reduced due to the multiple simultaneous measurements of the temporal order.

Adjusting the first entry based on the predetermined number of temporal orders may, e.g., comprise deriving an indicator value from the predetermined number of temporal orders which indicates whether the transition of the output signal from the first signal level to the second signal level, or the transition of the reference signal from the first signal level to the second signal level is leading the other one more often among the predetermined number of temporal orders. For example, a counter may be used for deriving the indicator value. The counter may, e.g., be increased if the output signal leads the reference signal, and be decreased if the reference signal leads the output signal. Accordingly, a counter value greater than zero indicates that the transition of the output signal from the first signal level to the second signal level leads the transition of the reference signal from the first signal level to the second signal level more often among the predetermined number of temporal orders, and vice versa. Adjusting the first entry based on the predetermined number of temporal orders may then further comprise adjusting the first entry based on the indicator value.

In some examples, the first entry may only be adjusted if the absolute value of the indicator value is greater than a threshold value. The threshold value may allow to calibrate the first entry in LUT only if it is not yet calibrated with sufficient accuracy. That is, adjustment of the first entry in the LUT may be omitted if the first entry is already calibrated with sufficient accuracy. The desired level of accuracy may be adjusted by selecting the threshold value.

The calibration of the entries in the LUT may, in some examples, be done iteratively. For example, measuring the predetermined number of temporal orders and adjusting the first entry based on the predetermined number of temporal orders may carried out iteratively. By iteratively calibrating the entries in the LUT, a high calibration accuracy may be achieved.

As indicated above, the DTC is not limited to generating the output signal based on the first entry in the LUT which is assigned to a first control code of the code sequence. The DTC may generate the output signal based on further entries in the LUT, wherein the further entries are assigned to further control codes for the DTC (i.e. other control codes of the code sequence). The method 100 may, hence, further comprise measuring, for the further entries, a respective temporal order of the transition of the output signal from the first signal level to the second signal level, and the transition of the reference signal from the first signal level to the second signal level. Also, the method 100 may further comprise adjusting the further entries based on the respective temporal order. Accordingly, all the entries in the LUT may be adjusted in order to compensate for DTC nonlinearity at the control codes of the code sequence.

The calibration may be done iteratively. That is, measuring the respective temporal order for the further entries may be carried out a predetermined number of times so that a respective predetermined number of temporal orders is measured for each of the further entries, and adjusting the further entries is based on the respective predetermined number of temporal orders. Accordingly, a high calibration accuracy may be achieved also for the further entries in the LUT.

In some examples, measuring the respective predetermined number of temporal orders for the first and the further entries of the LUT, and adjusting the first and the further entries is carried out iteratively until a maximum number of iterations is reached or each of the first and the further entries satisfies a quality criterion. The maximum number of iterations is a hard stop criterion. The quality criterion may be any quantity indicative of a desired accuracy of the calibration of the LUT entries. For example, the quality criterion may be that for each LUT entry the respective indicator value is smaller than the threshold value. Accordingly, a number for iterations required for achieving the quality criterion for all entries may be smaller than the maximum number of iterations.

In the above examples, only the temporal order with respect to one type of signal edge was used for calibrating an entry in the LUT. However, the method 100 may use further signal edges, i.e. falling and rising edges. In some examples, the method 100 may, hence, further comprise measuring, for the first entry, a second temporal order of a transition of the output signal from the second signal level to the first signal level, and a corresponding transition of the reference signal from the second signal level to the first signal level. Adjusting the first entry may then further be based on the second temporal order. Accordingly, respective second temporal orders may be measured for the further entries in the LUT, and the further LUT entries may be adjusted based on the respective second temporal orders. Like the first temporal orders, the second temporal orders may be measured a predetermined number of times (i.e. plural times) as described above.

Adjusting the LUT entries may be done in various ways. For example, adjusting 106 the first entry may comprise incrementing or decrementing the first entry based on the first temporal order. For example, the first entry may be incremented if the output signal of the DTC leads the reference signal, and vice versa.

Instead of incrementally filling the LUT, also other approaches like a binary search may be used. For example, iteratively adjusting the first entry as mentioned above may comprise incrementing or decrementing the first entry in the first iteration by a first value based on the predetermined number of temporal orders of the first iteration. Further, iteratively adjusting the first entry may comprise incrementing or decrementing the first entry in the second iteration by a second value based on the predetermined number of temporal orders of the second iteration, wherein the second value is (substantially) half of the first value. That is, for each iteration n (e.g. iteration n out of total N iterations), the first entry in the LUT is incremented or decremented by a value which is $2^{-(n-1)}$ times the first value (i.e. the value of the first iteration) based on the temporal order of the output signal and the reference signal for the $n^{th}$ iteration. This may allow for a defined calibration time and to reduce the required calibration iterations compared to the incremental approach above.

Figure 2:
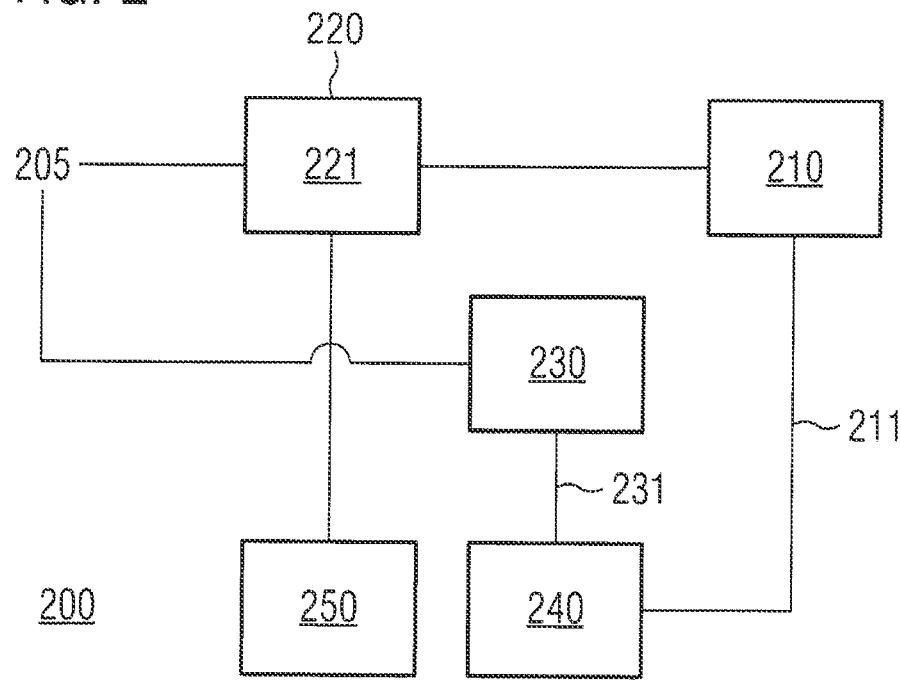
FIG. 2 illustrates an example of a system for calibrating a phase nonlinearity of a DTC.

In the following, various examples for implementing method 100 are discussed. FIG. 2 illustrates a system 200 for calibrating a phase nonlinearity of a DTC 210. The system 200 comprises a PLL 230 configured to generate, based on the control word 205, a reference signal 231. A frequency of the reference signal 231 is (substantially) equal to a frequency of an output signal 211 of the DTC 210. The system further comprises a detection circuit 240 configured to measure a temporal order of a transition of the output signal 211 from a first signal level to a second signal level, and a transition of the reference signal 231 from the first signal level to the second signal level. A processing circuit 250 of the system 200 is configured to adjust a first entry 221 of a LUT 220 based on the measured temporal order.

The DTC 210 may generate the output signal 211 based on the first entry 221 of the LUT 220. The first entry 211 is assigned to a first control code for the DTC 210 which is based on a control word 205 for controlling a frequency of the output signal 211.

Like method 100, the system 200 may allow to calibrate the first entry 221 of the LUT without changing the programming of the DTC 210 during the calibration. Accordingly, a background calibration may be performed (e.g. after a temperature change). Moreover, since the adjustment of the first entry 221 does not depend on the specific time difference between the output signal 211 and the reference signal 231, but merely on the temporal order, the detection circuit 240 needs to provide only a comparatively low time resolution. For example, the detection circuit 240 may be a BBPD.

Before the first entry 221 is configured, the system 200 may align the reference signal 231 and the DTC output signal 211. For example, the PLL 230 may be configured to adjust a phase of the reference signal 231 to be (substantially) equal to a phase of the output signal 211 generated by the DTC based on a second entry in the LUT 220. The second entry is assigned to a second control code for the DTC 210 for which the DTC 210 is phase linear.

The PLL 230 may, e.g., be configured to generate the reference signal 231 further based on a frequency control word. That is, the PLL 230 may generate the reference signal 231 based on the control word 205 and the frequency control word. Also, the detection circuit 240 (e.g. implemented as TDC) may be further configured to measure, for the second LUT entry, a time shift between a transition of the output signal 211 from the first signal level to the second signal level, and a transition of the reference signal 231 from the first signal level to the second signal level. Alternatively, the detection circuit 240 (e.g. implemented as BBPD) may be configured to measure, for the second LUT entry, a third temporal order of the transition of the output signal 211 from the first signal level to the second signal level, and the transition of the reference signal 231 from the first signal level to the second signal level. The system may further comprise a conversion circuit (not illustrated) configured to generate the frequency control word based on the time shift or the third temporal order.

For example, the conversion circuit may be configured to calculate, based on the time shift or the third temporal order, a phase error of the reference signal 231 with respect to the output signal 211. Further, the conversion circuit may be configured to adjust the frequency control word based on the phase error.

In some examples, the system 200 may additionally comprise a filter (not illustrated) coupled between the detection circuit 240 and the conversion circuit. The filter may be configured to only forward filtered data from the detection circuit 240 to the conversion circuit if a control signal input to the filter indicates that the DTC 210 generates the output signal based on an entry in the LUT 220 which is assigned to a control code for the DTC 210 for which the DTC 210 is phase linear. That is, the filter forwards data from the detection circuit 240 to the conversion circuit if the DTC generates the output signal based on the second entry in the LUT, but does not forward data from the detection circuit 240 to the conversion circuit if the DTC generates the output signal based on the first entry in the LUT. Accordingly, the filter may ensure that the frequency control word is only adjusted if the DTC generates the output signal based on a control word for which the DTC 210 is (by definition) phase linear.

As indicated above, the detection circuit 240 may be a BBPD. Also, the PLL 230 may exhibit a comparatively high jitter (e.g. the PLL 230 may be inductor less). This may affect the accuracy of the measured temporal order. In order to achieve a high calibration accuracy, plural temporal orders may be measured and averaged. Therefore, the detection circuit 240 may be further configured to measure the temporal order a predetermined number of times so that a predetermined number of temporal orders is measured. Further, the processing circuit 250 may be further configured to adjust the first entry 221 based on the predetermined number of temporal orders.

For example, the detection circuit 240 may be further configured to measure at least part of the predetermined number of temporal orders in parallel. The detection circuit 250 may therefore comprise a plurality of measurement cells. Each of the measurement cells may be configured to measure the temporal order of the output signal and the reference signal. Accordingly, the temporal order may be measured simultaneously. For example, the detection circuit 240 may comprise a plurality of BBPD cells.

For processing the plural temporal orders, the processing circuit 250 may be further configured to derive an indicator value from the predetermined number of temporal orders which indicates whether the transition of the output signal 211 from the first signal level to the second signal level, or the transition of the reference signal 231 from the first signal level to the second signal level is leading the other one more often among the predetermined number of temporal orders. Further, the processing circuit 250 may be configured to adjust the first entry 221 based on the indicator value. For example, a counter may be executed by the processing circuit 250 for deriving the indicator value.

In some examples, the processing circuit 250 may be further configured to adjust the first entry 221 only if the absolute value of the indicator value is greater than a threshold value. The threshold value may allow to calibrate the first entry in LUT only if it is not yet calibrated with sufficient accuracy. The desired level of accuracy may be adjusted by selecting the threshold value.

Like the method 100, the system 200 may be configured to iteratively calibrate the first entry 221 in the LUT 220. For example, the system 200 may be configured to control the detection circuit 240 to iteratively measure the predetermined number of temporal orders. The system 200 may further be configured to control the processing circuit 250 to iteratively adjust the first entry 221 based on the predetermined number of temporal orders.

However, the system 200 is not limited to calibrating only the first entry 221 in the LUT. As discussed above, the DTC 210 may generate the output signal based on further entries in the LUT 220. The further entries are assigned to further control codes for the DTC 210. Therefore, the detection circuit 240 may be further configured to measure, for the further entries, a respective temporal order of the transition of the output signal 211 from the first signal level to the second signal level, and the transition of the reference signal 231 from the first signal level to the second signal level. Accordingly, the processing circuit 250 may be further configured to adjust the further entries in the LUT 220 based on the respective temporal order.

Like for the first entry 221 in the LUT 220, the detection circuit 240 may be further configured to measure the respective temporal order for the further entries a predetermined number of times so that a respective predetermined number of temporal orders is measured for each of the further entries. Likewise, the processing circuit 250 may be further configured to adjust the further entries in the LUT 220 based on the respective predetermined number of temporal orders. Accordingly, a high calibration accuracy may be achieved also for the entries in the LUT 220.

Also for the further entries, the calibration may be done iteratively. That is, the system 200 may be configured to control the detection circuit 240 to iteratively measure the respective predetermined number of temporal orders for the first and the further entries of the LUT 220. Also, the system 200 may be configured to control the processing circuit 250 to iteratively adjust the first and the further entries in the LUT 220 until a maximum number of iterations is reached or each of the first and the further entries in the LUT 220 satisfies a quality criterion. The quality criterion may be any quantity indicative of a desired accuracy of the calibration of the LUT entries. For example, the quality criterion may be that for each LUT entry the respective absolute value of the indicator value is smaller than the threshold value. Accordingly, a number for iterations required for achieving the quality criterion for all entries may be smaller than the maximum number of iterations.

In the above examples, the system 200 was configured to adjust the LUT entries based on only one type of signal edge. However, the system 200 may further be configured to use more signal edges, i.e. rising and falling signal edges. Therefore, the detection circuit 240 may in some examples be further configured to measure, for the first entry 221, a second temporal order of a transition of the output signal 211 from the second signal level to the first signal level, and a corresponding transition of the reference signal 231 from the second signal level to the first signal level. Accordingly, the processing circuit 250 may be further configured to adjust the first entry 221 in the LUT 220 further based on the second temporal order. Also for the other entries in the LUT 220, the detection circuit 240 may be configured to measure one or more respective second temporal orders, and the processing circuit 250 may be configured to adjust the respective entry in the LUT 220 based on the measured respective second temporal order(s).

As discussed above in connection with method 100, the entries in the LUT 220 may be adjusted in a plurality of ways based on the measured temporal order(s). For example, the processing circuit 250 may be further configured to adjust the first entry 221 by incrementing or decrementing the first entry 221 based on the first temporal order.

Also, the processing circuit 250 may be further configured to iteratively adjust the first entry 211 based on a binary search. That is, for each iteration n (e.g. iteration n out of total N iterations), the processing circuit 250 may be configured to increment or decrement by a value which is $2^{-(n-1)}$ times the value of the first iteration based on the temporal order of the output signal and the reference signal for the $n^{th}$ iteration. For example, the processing circuit 250 may be configured to increment or decrement the first entry 221 in the first iteration by a first value based on the predetermined number of temporal orders of the first iteration, and to increment or decrement the first entry 221 in the second iteration by a second value based on the predetermined number of temporal orders of the second iteration. The second value is (substantially) half of the first value. This may allow for a defined calibration time and to reduce the required calibration iterations compared to the incremental approach above.

Figure 3:
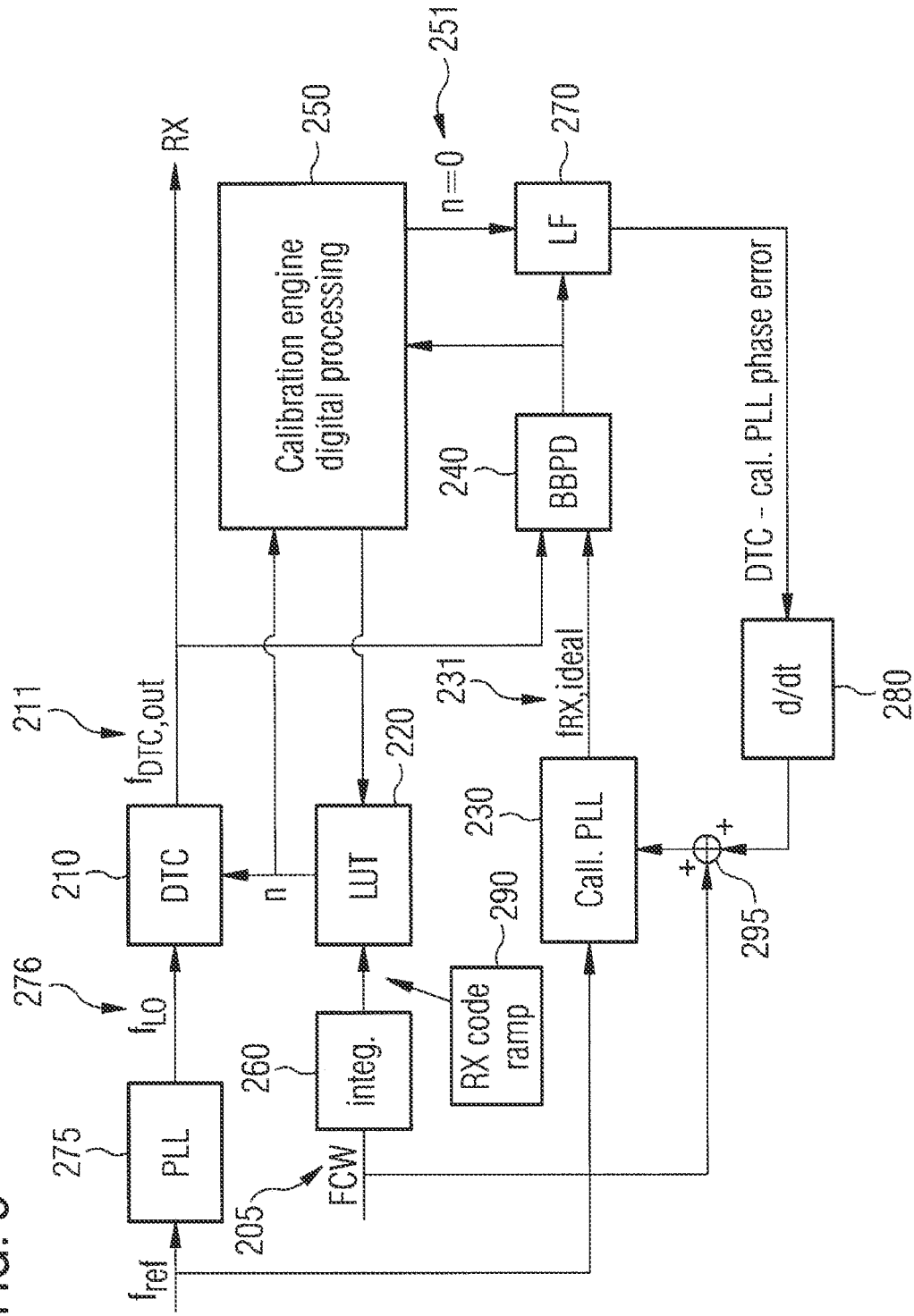
FIG. 3 illustrates another system for calibrating a phase nonlinearity of a DTC.

In FIG. 3, another system 300 for calibrating a phase nonlinearity of a DTC 210 is illustrated. In the example illustrated in FIG. 3, the DTC 210 is part of a receiver. The DTC 210 supplies its output signal 211 to a mixing circuit (not illustrated) of the receiver, which down-converts a radio frequency receive signal using the output signal 211.

The system 300 comprises the circuitry necessary for generating the RX signal (i.e. output signal 211) for the mixing circuit. The RX generation comprises a RX PLL 275 for generating the oscillating input signal 276 for the DTC 210 (i.e. a reference local oscillator signal). Further, the RX generation comprises the DTC 210 that is programmed with (based on) a control code n∈[0, N] (with max. DTC control code N) for generating the desired RX frequency $f_{DTC,out}$. The RX generation also comprises a LUT 220 to correct for DTC nonlinearity. The LUT 220 comprises for each control code an entry. Each entry in the LUT 220 is based on the assigned control code and adjusted based on the DTC nonlinearity for the respective control code (i.e. the entries in the LUT 220 may be understood as pre-distorted control codes for the DTC 210 in order to account for the DTC nonlinearity). Additionally, the RX generation comprises a control circuit 260 (e.g. implemented as digital part) for generating an RX control code sequence (control code ramp) 290 by integrating a control word (FCW) 205 for controlling the frequency $f_{DTC,out}$ of the output signal 211.

The calibration engine adds the (calibration) PLL 230 for generating a reference signal 231 having the same frequency as the output signal 211 of the DTC 210, i.e. $f_{RX,ideal} = f_{DTC,out}$. The calibration PLL 230 uses the same FCW 205 from which the DTC programming is derived. That is, the reference signal 231 is based on the control word 205 $f_{DTC,out}$ may exhibit the ideal output frequency that is desired at the output of the DTC 210, but is distorted by the DTC nonlinearity. Furthermore, the RX PLL 275 and the calibration PLL 230 receive the same reference frequency $f_{ref}$ for generating the oscillating input signal 276 for the DTC 210 and the reference signal 231 based on the reference frequency $f_{ref}$, respectively.

The DTC output signal 211 and the reference signal 231 have identical frequency, but their phase is initially not aligned. To lock their phase, a BBPD 240 which servers as detection circuit compares $f_{RX,ideal}$ and $f_{DTC,out}$. In the closed calibration DTC-PLL control loop consisting of BBPD 240, (loop) filter (LF) 270, and differentiator 280 (serving as conversion circuit for converting the phase error to a frequency for programming the calibration PLL 230), the phase error between the output signal 211 and the reference signal 231 is reduced to zero.

However, only DTC edges (i.e. signal edges of the output signal 211) for control codes with zero Integrated NonLinearity (INL), i.e. control codes for which the DTC 210 is phase linear (e.g. per definition control code n=0, which is the 0° phase reference of the output signal 211) are used to lock the phase of the calibration PLL 230 to the DTC 210.

The calibration PLL 230 may exhibit poor signal quality. For example, the PLL 230 may be inductor less or be based on a ring oscillator.

The objective of the first step is to calibrate out any phase offsets between the PLL 230 and DTC 210, i.e. any phase offset between the reference signal 231 and the output signal 211. The DTC 210 generates the output signal 211 (RX signal) according to a RX code ramp (sequence). The LUT 220 may be filled with arbitrary data (zeros, data from previous calibration, random data). The calibration may be initialized according to following algorithm.

First, the DTC-PLL control loop is opened. Then the calibration PLL 230 is locked to $f_{RX,ideal} = f_{DTC,out}$. That is, the frequency of the reference signal 231 is adjusted to the frequency of the output signal 211. Now, the DTC-PLL control loop is closed. The LF 270 of the DTC-PLL is only fed with data for DTC control codes with inherently zero INL (e.g. code n=0 has zero INL per definition). The processing circuit 250 (i.e. the calibration engine) indicates to the LF 270 which inputs to process. That is, the filter 270 is configured to only process data from the BBPD 240 and forward the filtered data to the differentiator 280 if a control signal 251 input to the filter 270 indicates that the (currently) measured edge of the DTC output signal 211 is based on an entry in the LUT 220 which is assigned to a control code for the DTC 210 for which the DTC 210 is phase linear. The differentiator 280 converts the phase error to a frequency for programming the calibration PLL 230. In particular, the differentiator 280 generates a frequency control word for the calibration PLL 230. The frequency control word is combined with the FCW 205 to generate a control word for the calibration PLL 230. The above processing may be iteratively repeated during the whole calibration process.

As the DTC-PLL loop only operates on the DTC codes with (per definition) ideal linearity, it is not affected by LUT programming. Now, the calibration algorithm can be started.

Each rising and/or falling DTC output is compared to the ideal RX signal by the BBPD 240, which allows phase detection at a rate of $f_{DTC,out}$. For each measured edge, the programmed DTC control code is known to the calibration engine (e.g. the processing circuit 250 may read it from the LUT 220). For example, if the measured DTC edge (i.e. output signal 211) has a positive time offset compared to the edge of the reference signal 231, the DTC 210 has a positive nonlinearity for the specific code. If this is the case, the LUT entry at this position is decremented by the processing circuit 250. Vice versa, for a negative time offset, the LUT entry is incremented by the processing circuit.

For example, the calibration may be implemented by:

1) Measuring if the rising DTC output 211 or the rising ideal RX signal 231 is first. DTC signal 211 first leads to '−1' at the BBPD 240 output, RX signal 231 first leads to '1'. The DTC output signal 211 is generated for a first DTC control code n (i.e. based on a first entry in the LUT 220 which is assigned to the first control code).

2) Programming the LUT correspondingly:
   a. If the BBPD 240 output is '−1': Increment the LUT entry at code n.
   b. If the BBPD 240 output is '1': Decrement the LUT entry at code n.

3) Moving to 1) and measure the next DTC output edge.

Due to the required high calibration accuracy and the potentially high jitter of the calibration PLL 230, the measurements may be averaged. For example, this may be done by measuring several values per control code, and storing them by accumulating the BBPD 240 output in a counter inside the calibration engine digital part (i.e. the processing circuit 250 executes a counting operation). After a desired averaging, the counter value may be evaluated and the LUT 220 may be programmed accordingly. As indicated above, threshold values for the counter may be used to define a stop-criterion for the calibration. For example, if an (substantially) equal amount of measured points for the same code have a positive and negative time offset to the reference (i.e. the counter is zero or almost zero), the calibration for this code can be stopped as it is calibrated ideally. If a random dither is added to the DTC RX sequence 290, it can be averaged out in the same fashion.

For example, a number of A measurements is done for each DTC control code (i.e. for each entry in the LUT 220), and the BBPD 240's output is summed up in a counter c[n] (i.e. one counter is used for each of the N+1 DTC control codes to accelerate calibration). If the majority of measured edges indicate '−1' at the BBPD 240's output, the corresponding LUT value is incremented, else it is decremented by the processing circuit 250. A counter threshold value $c_{thres}$ may indicate if the calibration is finished with sufficient accuracy. A maximum number of iteration $l_{max}$ is further defined to have a hard stop criterion. The full algorithm (method) may be as follows:

1) Defining an averaging factor A which determines how many measurements are averaged (i.e. A defines the accuracy). Further, defining the maximum number of iterations $l_{max}$.

2) Setting the iteration counter to i=0.

3) Setting the averaging counter to α=0.

4) Measuring if the rising DTC output 211 or the rising ideal RX signal 231 is first. DTC output 211 first leads to '−1' at the BBPD 240 output, whereas RX signal 231 first leads to '1'. Noting the active DTC control code n.

5) Programing the internal calibration counter c[n]:
   a. If the BBPD output is '−1': Incrementing the counter c[n]
   b. If the BBPD output is '1': Decrementing the counter c[n]

6) Incrementing the averaging counter α.

7) If α=A·N moving to 8), else moving to 4) and measuring the subsequent rising DTC output 211.

8) $\forall n \in [0, N]$: incrementing the corresponding LUT entry if $c[n] > c_{thres}$, decrementing the corresponding LUT entry if $c[n] < -c_{thres}$, or mark control code n as calibrated if $c_{thres} \le c[n] \le c_{thres}$.

9) Increase the iteration counter i.

10) If control code n is marked as calibrated $\forall n \in [0, N]$ OR $i = I_{max}$ move to 11), else move to 3).

11) Stop calibration.

As indicated above, the above rising edge calibration may be changed to a falling edge or a double edge calibration. Instead of the incremental LUT filling, also other algorithms like, e.g., a binary search may be used. A binary search may enable a defined calibration time and allow to further reduce the number of required calibration iterations. For a binary search, the algorithm stop criteria (quality criteria) may be adapted accordingly.

The implementation of the BBPD 240 may have arbitrary complexity. As indicated above, multiple parallel BBPD cells may be used to reduce mismatch influence, increase accuracy, and reduce calibration time through multiple simultaneous measurements.

In other words, FIG. 3 may illustrate a calibration engine that focuses on RX DTC operation. An, e.g., inductor-less calibration PLL 230 generates an ideal RX signal 231, and the DTC output 211 is compared against it with a BBPD 240. The LUT 220 of the DTC 210 is then for example filled incrementally with calibration data, until, e.g., a threshold of accuracy is achieved between ideal RX and DTC generated RX signal. The architecture of the calibration engine allows it to re-calibrate during DTC operation if needed.

As indicated above, an inductor-less calibration PLL 230 may be used to generate the reference signal $f_{RX,ideal}$ for RX DTC calibration, wherein the reference signal is locked to the DTC output phase. The two signals 1) DTC output signal at $f_{DTC,out}$ (generated by RX control code ramp) and 2) calibration PLL signal at $f_{RX,ideal}$ may be compared with BBPD 240 to extract the direction of the DTC nonlinearity compared to the ideal RX signal. Compared to other detection circuits like a TDC, the BBPD may run on up to the rate of the oscillating input signal 276 for the DTC, and hence reduce the calibration time. The LUT 220 may be incrementally filled based on the extracted information. Averaging of measurements may be used to increase the resolution and to reduce the influence of DTC and calibration PLL jitter.

Figure 4:
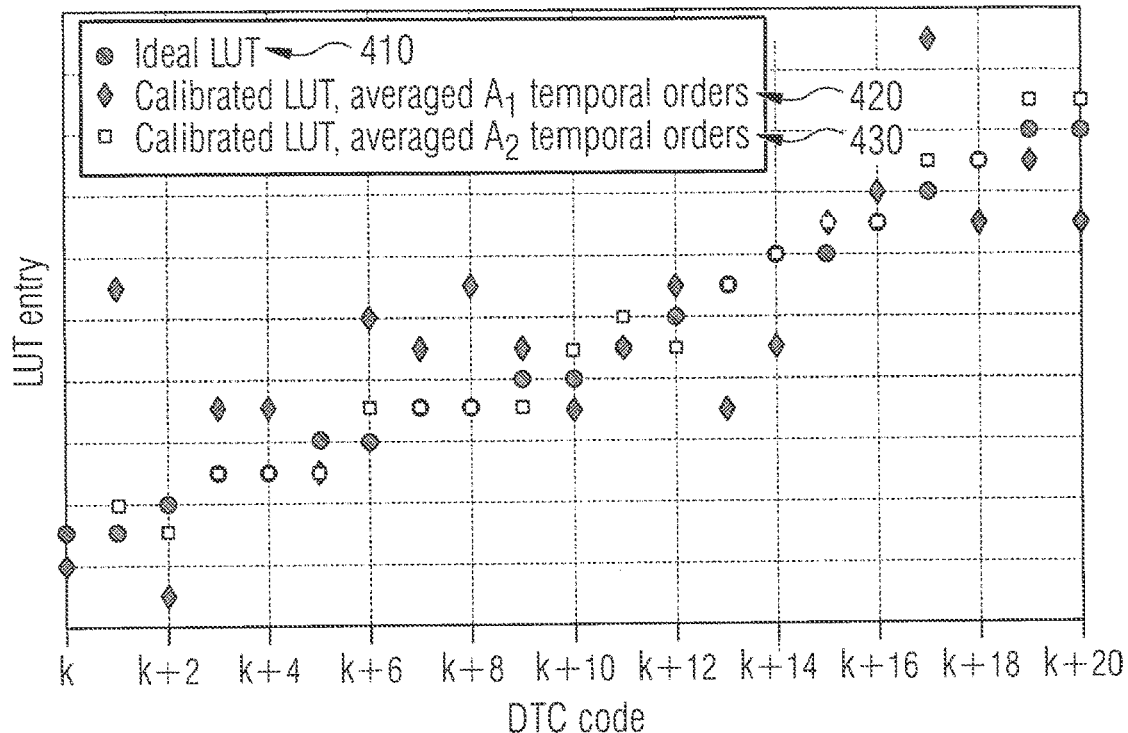
FIG. 4 illustrates a comparison between ideal and calibrated look-up table entries.

The accuracy of the proposed calibration scheme may become evident from the below discussion of FIGS. 4 and 5. FIG. 4 illustrates a comparison between ideal and calibrated look-up table entries. The abscissa denotes the control code for the DTC, and the ordinate denotes the entry in the LUT for the respective control code.

The circular points 410 indicate the ideal entries for the control codes, i.e. the entry assigned to each control code for best compensation of the DTC nonlinearity at the respective control code.

The diamond-shaped data points 420 indicate the entries of the LUT after a defined number of calibration iterations according to the proposed concept. For the diamond-shaped data points 420 a first number $A_1$ of temporal order was measured and averaged for each iteration.

The square data points 430 indicate the entries of the LUT after the defined number of calibration iterations according to the proposed concept. For the square data points 420 a second number $A_2$ of temporal order was measured and averaged for each iteration. $A_2$ is greater than $A_1$.

It is evident from FIG. 4 that the accuracy of the calibration is better for a greater number of averaged measurements.

Figure 5:
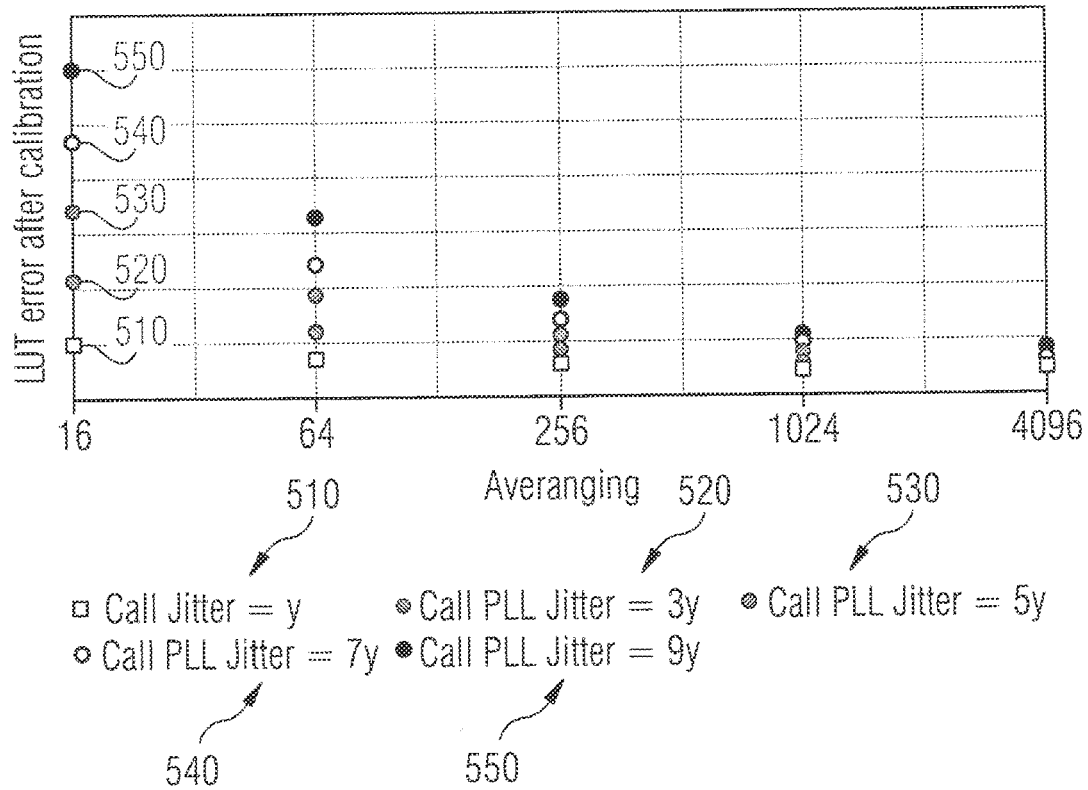
FIG. 5 illustrates a comparison of look-up table entry errors for different calibration parameters.

FIG. 5 further illustrates a comparison of LUT entry errors for different calibration parameters. The abscissa denotes the number of measured and averaged temporal orders. The ordinate denotes the average (e.g. Root Mean Square, RMS) error of the LUT entries compared to the ideal LUT entries. The data points 510 denote the error of the LUT entries for a first jitter y of the PLL used for generating the reference signal. The data points 520 denote the error of the LUT entries for a second jitter 3·y of the PLL (i.e. the second jitter is three times the first jitter). The data points 530 denote the error of the LUT entries for a third jitter 5·y of the PLL The data points 540 denote the error of the LUT entries for a fourth jitter 7·y of the PLL. The data points 550 denote the error of the LUT entries for a fifth jitter 9·y of the PLL.

It is again evident from FIG. 5 that the accuracy of the calibration is better for a greater number of averaged measurements. Further, it is evident from FIG. 5 that the accuracy of the calibration is better for lower jitter of the calibration PLL used for generating the reference signal. For calibrating the LUT with a desired accuracy, a trade-off may be made between the jitter of the calibration PLL and the number of averaged temporal orders (i.e. the runtime of the calibration).

Generally speaking, some examples presented herein relate to a means for calibrating a phase nonlinearity of a DTC. The means comprises a means for generating, based on a control word, a reference signal using a PLL, wherein a frequency of the reference signal is equal to a frequency of an output signal of the DTC. The means further comprises a means for measuring a temporal order of a transition of the output signal from a first signal level to a second signal level, and a transition of the reference signal from the first signal level to the second signal level. Additionally, the means comprises a means for adjusting a first entry of a LUT based on the measured temporal order.

The DTC may generate the output signal based on the first entry of the LUT, wherein the first entry is assigned to a first control code for the DTC which is based on the control word for controlling the frequency of the output signal.

In some examples, the means for generating the reference signal may be further configured to adjust a phase of the reference signal to be equal to a phase of the output signal generated by the DTC based on a second entry in the LUT, wherein the second entry is assigned to a second control code for the DTC for which the DTC is (by definition) phase linear.

The means for calibrating a phase nonlinearity of a DTC may be implemented by a system for calibrating a phase nonlinearity of a DTC described above or below (e.g. FIG. 2). The means for generating the reference signal may be implemented by a PLL described above or below (e.g. FIG. 2). The means for measuring a temporal order may be implemented by a detection circuit described above or below (e.g. FIG. 2). The means for adjusting the first entry may be implemented by a processing circuit described above or below (e.g. FIG. 2).

Figure 6:
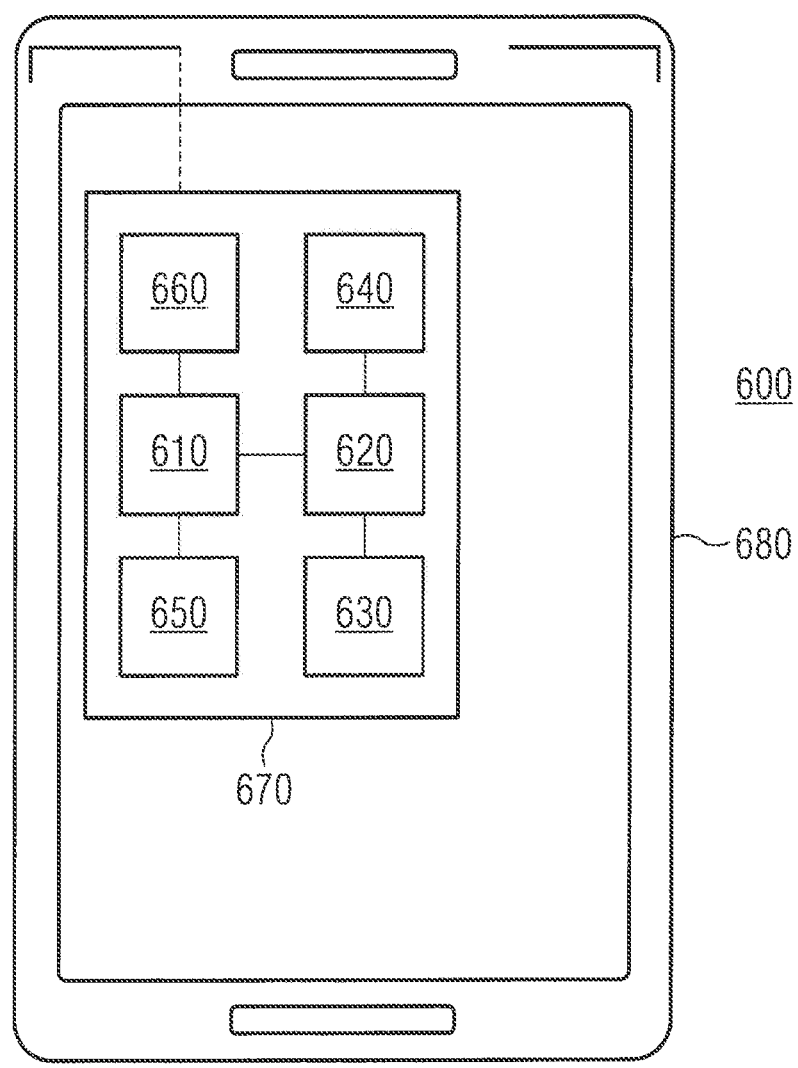
FIG. 6 illustrates an example of a mobile device comprising a DTC and a system for calibrating a phase nonlinearity of the DTC.

An example of an implementation using a system for calibrating a phase nonlinearity of a DTC according to one or more aspects of the proposed architecture or one or more examples described above is illustrated in FIG. 6. FIG. 6 schematically illustrates an example of a mobile device 600 (e.g. mobile phone, smartphone, tablet-computer, or laptop) comprising a DTC 610 which generates a radio frequency output signal based on entries in a LUT 620. The mobile device 600 further comprises a system 630 for calibrating a phase nonlinearity of a DTC according to an example described herein.

For example, a receiver 670 may comprise the DTC 610, the LUT 620 and the system 630.

To this end, a mobile device 600 may be provided enabling fully digital receive carrier generation. Accordingly, a number of on-chip inductors may be reduced so that a chip area may be reduced and crosstalk issues be mitigated.

The receiver 670 may comprise one or more additional components. For example, the receiver 670 may comprise a control circuit 640 configured to generate, based on the control word, a continuously rising or falling code sequence, wherein the first control code for the DTC 610 is part of the code sequence. The receiver 670 may also comprise a PLL 650 configured to generate an oscillating input signal for the DTC 610. Further, the receiver 670 may comprise a mixing circuit 660 configured to down-convert a radio frequency receive signal using the output signal of the DTC 610.

For example, the receiver 670 may be configured to operate according to one of the 3GPP-standardized mobile communication networks or systems. The mobile or wireless communication system may correspond to, for example, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN), or mobile communication networks with different standards, for example, a Worldwide Interoperability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

At least one antenna element 680 of the mobile device 600 may be coupled to the receiver 670.

The examples as described herein may be summarized as follows:

Example 1 is a method for calibrating a phase nonlinearity of a digital-to-time converter, comprising: generating, based on a control word, a reference signal using a phase-locked loop, wherein a frequency of the reference signal is substantially equal to a frequency of an output signal of the digital-to-time converter; measuring a temporal order of a transition of the output signal from a first signal level to a second signal level, and a transition of the reference signal from the first signal level to the second signal level; and adjusting a first entry of a look-up table based on the measured temporal order.

In example 2, the digital-to-time converter in the method of example 1 generates the output signal based on the first entry of the look-up table, wherein the first entry is assigned to a first control code for the digital-to-time converter which is based on the control word for controlling the frequency of the output signal.

In example 3, the method of example 1 or example 2 further comprises: adjusting a phase of the reference signal to be substantially equal to a phase of the output signal generated by the digital-to-time converter based on a second entry in the look-up table, wherein the second entry is assigned to a second control code for the digital-to-time converter for which the digital-to-time converter is phase linear.

In example 4, generating the reference signal in the method of example 3 is further based on a frequency control word, and wherein adjusting the phase of the reference signal comprises: measuring, for the second entry, a time shift between a transition of the output signal from the first signal level to the second signal level, and a transition of the reference signal from the first signal level to the second signal level; and generating the frequency control word based on the time shift.

In example 5, adjusting the frequency control word in the method of example 4 comprises: calculating, based on the time shift, a phase error of the reference signal with respect to the output signal; and adjusting the frequency control word based on the phase error.

In example 6, generating the reference signal in the method of example 3 is further based on a frequency control word, and wherein adjusting the phase of the reference signal comprises: measuring, for the second entry, a third temporal order of a transition of the output signal from the first signal level to the second signal level, and a transition of the reference signal from the first signal level to the second signal level; and generating the frequency control word based on the third temporal order.

In example 7, adjusting the frequency control word in the method of example 6 comprises: calculating, based on the third temporal order, a phase error of the reference signal with respect to the output signal; and adjusting the frequency control word based on the phase error.

In example 8, the method of example 2 further comprises: measuring a phase error of the reference signal with respect to a phase of the output signal generated by the digital-to-time converter based on a second entry in the look-up table, wherein the second entry is assigned to a second control code for the digital-to-time converter for which the digital-to-time converter is phase linear; and generating a correction code based on the phase offset, wherein the first control code is further based on the correction code.

In example 9, measuring the temporal order in the method of any of the preceding examples comprises measuring a predetermined number of temporal orders, wherein adjusting the first entry is based on the predetermined number of temporal orders.

In example 10, at least part of the predetermined number of temporal orders in the method of example 9 is measured in parallel.

In example 11, adjusting the first entry based on the predetermined number of temporal orders in the method of example 9 or example 10 comprises: deriving an indicator value from the predetermined number of temporal orders which indicates whether the transition of the output signal from the first signal level to the second signal level, or the transition of the reference signal from the first signal level to the second signal level is leading the other one more often among the predetermined number of temporal orders; and adjusting the first entry based on the indicator value.

In example 12, the first entry is only adjusted in the method of example 11 if the absolute value of the indicator value is greater than a threshold value.

In example 13, measuring the predetermined number of temporal orders and adjusting the first entry based on the predetermined number of temporal orders is carried out iteratively in the method of any of examples 9 to 12.

In example 14, the digital-to-time converter in the method of example 13 generates the output signal based on further entries in the look-up table, the further entries being assigned to further control codes for the digital-to-time converter, wherein the method further comprises: measuring, for the further entries, a respective temporal order of the transition of the output signal from the first signal level to the second signal level, and the transition of the reference signal from the first signal level to the second signal level; and adjusting the further entries based on the respective temporal order.

In example 15, measuring the respective temporal order for the further entries in the method of example 14 is carried out a predetermined number of times so that a respective predetermined number of temporal orders is measured for each of the further entries, wherein adjusting the further entries is based on the respective predetermined number of temporal orders.

In example 16, measuring the respective predetermined number of temporal orders for the first and the further entries of the look-up table, and adjusting the first and the further entries in the method of example 15 is carried out iteratively until a maximum number of iterations is reached or each of the first and the further entries satisfies a quality criterion.

In example 17, the method of any of the preceding examples further comprises: measuring, for the first entry, a second temporal order of a transition of the output signal from the second signal level to the first signal level, and a transition of the reference signal from the second signal level to the first signal level, wherein adjusting the first entry is further based on the second temporal order.

In example 18, adjusting the first entry in the method of any of the preceding examples comprises: incrementing or decrementing the first entry based on the first temporal order.

In example 19, iteratively adjusting the first entry in the method of example 13 comprises: incrementing or decrementing the first entry in the first iteration by a first value based on the predetermined number of temporal orders of the first iteration; and incrementing or decrementing the first entry in the second iteration by a second value based on the predetermined number of temporal orders of the second iteration, wherein the second value is substantially half of the first value.

In example 20, a bang-bang phase detector is used for measuring the temporal order in the method of any of the preceding examples.

In example 21, the first control code for the digital-to-time converter in the method of example 2 is part of a continuously rising or falling code sequence generated based on the control word.

Example 22 is a system for calibrating a phase nonlinearity of a digital-to-time converter, comprising: a phase-locked loop configured to generate, based on a control word, a reference signal, wherein a frequency of the reference signal is substantially equal to a frequency of an output signal of the digital-to-time converter; a detection circuit configured to measure a temporal order of a transition of the output signal from a first signal level to a second signal level, and a transition of the reference signal from the first signal level to the second signal level; and a processing circuit configured to adjust a first entry of a look-up table based on the measured temporal order.

In example 23, the digital-to-time converter in the system of example 22 generates the output signal based on the first entry of the look-up table, wherein the first entry is assigned to a first control code for the digital-to-time converter which is based on the control word for controlling the frequency of the output signal.

In example 24, the phase-locked loop in the system of example 22 or example 23 is configured to adjust a phase of the reference signal to be substantially equal to a phase of the output signal generated by the digital-to-time converter based on a second entry in the look-up table, wherein the second entry is assigned to a second control code for the digital-to-time converter for which the digital-to-time converter is phase linear.

In example 25, the phase-locked loop in the system of example 24 is further configured to generate the reference signal based on a frequency control word, wherein the detection circuit is further configured to measure, for the second entry, a time shift between a transition of the output signal from the first signal level to the second signal level, and a transition of the reference signal from the first signal level to the second signal level; and wherein the system further comprises a conversion circuit configured to generate the frequency control word based on the time shift.

In example 26, the conversion circuit in the system of example 25 is configured to: calculate, based on the time shift, a phase error of the reference signal with respect to the output signal; and adjust the frequency control word based on the phase error.

In example 27, the phase-locked loop in the system of example 24 is further configured to generate the reference signal based on a frequency control word, wherein the detection circuit is further configured to measure, for the second entry, a third temporal order of a transition of the output signal from the first signal level to the second signal level, and a transition of the reference signal from the first signal level to the second signal level; and wherein the system further comprises a conversion circuit configured to generate the frequency control word based on the third temporal order.

In example 28, the conversion circuit in the system of example 27 is configured to: calculate, based on the third temporal order, a phase error of the reference signal with respect to the output signal; and adjust the frequency control word based on the phase error.

In example 29, the system of any of examples 25 to 28 further comprises a filter coupled between the detection circuit and the conversion circuit, wherein the filter is configured to only forward filtered data from the detection circuit to the conversion circuit if a control signal input to the filter indicates that the digital-to-time converter generates the output signal based on an entry in the look-up table which is assigned to a control code for the digital-to-time converter for which the digital-to-time converter is phase linear.

In example 30, the detection circuit in the system of any of the preceding examples is further configured to measure a predetermined number of temporal orders, wherein the processing circuit is further configured to adjust the first entry based on the predetermined number of temporal orders.

In example 31, the detection circuit in the system of example 30 is further configured to measure at least part of the predetermined number of temporal orders in parallel.

In example 32, the processing circuit in the system of example 30 or example 31 is further configured to: derive an indicator value from the predetermined number of temporal orders which indicates whether the transition of the output signal from the first signal level to the second signal level, or the transition of the reference signal from the first signal level to the second signal level is leading the other one more often among the predetermined number of temporal orders; and adjust the first entry based on the indicator value.

In example 33, the processing circuit in the system of example 32 is further configured to adjust the first entry only if the absolute value of the indicator value is greater than a threshold value.

In example 34, the system of any of examples 30 to 33 is configured to control the detection circuit to iteratively measure the predetermined number of temporal orders, and to control the processing circuit to iteratively adjust the first entry based on the predetermined number of temporal orders.

In example 35, the digital-to-time converter in the system of example 34 further generates the output signal based on further entries in the look-up table, the further entries being assigned to further control codes for the digital-to-time converter; wherein the detection circuit is further configured to measure, for the further entries, a respective temporal order of the transition of the output signal from the first signal level to the second signal level, and the transition of the reference signal from the first signal level to the second signal level; and wherein the processing circuit is further configured to adjust the further entries based on the respective temporal order.

In example 36, the detection circuit in the system of example 35 is further configured to measure the respective temporal order for the further entries a predetermined number of times so that a respective predetermined number of temporal orders is measured for each of the further entries, wherein the processing circuit is further configured to adjust the further entries based on the respective predetermined number of temporal orders.

In example 37, the system of example 36 is configured to control the detection circuit to iteratively measure the respective predetermined number of temporal orders for the first and the further entries of the look-up table, and to control the processing circuit to iteratively adjust the first and the further entries until a maximum number of iterations is reached or each of the first and the further entries satisfies a quality criterion.

In example 38, the detection circuit in the system of any of the preceding examples is further configured to measure, for the first entry, a second temporal order of a transition of the output signal from the second signal level to the first signal level, and a transition of the reference signal from the second signal level to the first signal level; and the processing circuit is further configured to adjust the first entry further based on the second temporal order.

In example 39, the processing circuit in the system of any of the preceding examples is further configured to adjust the first entry by incrementing or decrementing the first entry based on the first temporal order.

In example 40, the processing circuit in the system of example 34 is further configured to iteratively adjust the first entry by: incrementing or decrementing the first entry in the first iteration by a first value based on the predetermined number of temporal orders of the first iteration; and incrementing or decrementing the first entry in the second iteration by a second value based on the predetermined number of temporal orders of the second iteration, wherein the second value is substantially half of the first value.

In example 41, the detection circuit the system of any of the preceding examples is a bang-bang phase detector.

Example 42 is a receiver comprising a digital-to-time converter and a system for calibrating a phase nonlinearity of the digital-to-time converter according to any of example 22 to 41.

In example 43, the receiver of example 42 further comprises: a control circuit configured to generate, based on the control word, a continuously rising or falling code sequence, wherein the first control code is part of the code sequence.

In example 44, the receiver of example 42 or example 43 further comprises: a further phase-locked loop configured to generate an oscillating input signal for the digital-to-time converter.

In example 45, the receiver of any of examples 42 to 44 further comprises: a mixing circuit configured to down-convert a radio frequency receive signal using the output signal.

Example 46 is a mobile device comprising a receiver according to any of examples 42 to 45.

In example 47, the mobile device of example 46 further comprises: at least one antenna element coupled to the receiver.

Example 48 is a means for calibrating a phase nonlinearity of a digital-to-time converter, comprising: a means for generating, based on a control word, a reference signal using a phase-locked loop, wherein a frequency of the reference signal is equal to a frequency of an output signal of the digital-to-time converter; a means for measuring a temporal order of a transition of the output signal from a first signal level to a second signal level, and a transition of the reference signal from the first signal level to the second signal level; and a means for adjusting a first entry of a look-up table based on the measured temporal order.

In example 49, the digital-to-time converter in the means of example 48 generates the output signal based on the first entry of the look-up table, wherein the first entry is assigned to a first control code for the digital-to-time converter which is based on the control word for controlling the frequency of the output signal.

In example 50, the means for generating the reference signal in the means of example 48 or example 49 is further configured to adjust a phase of the reference signal to be substantially equal to a phase of the output signal generated by the digital-to-time converter based on a second entry in the look-up table, wherein the second entry is assigned to a second control code for the digital-to-time converter for which the digital-to-time converter is phase linear.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s·th." may be implemented as a "means configured to or suited for s·th", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for calibrating a phase nonlinearity of a digital-to-time converter, comprising:
   generating, based on a control word, a reference signal using a phase-locked loop, wherein a frequency of the reference signal is substantially equal to a frequency of an output signal of the digital-to-time converter;
   measuring a temporal order of a transition of the output signal from a first signal level to a second signal level, and a transition of the reference signal from the first signal level to the second signal level, wherein the temporal order indicates which of the output signal and the reference signal switches first from the first signal level to the second signal level; and
   adjusting a first entry of a look-up table based on the measured temporal order.

2. The method of claim 1, wherein the digital-to-time converter generates the output signal based on the first entry of the look-up table, and wherein the first entry is assigned to a first control code for the digital-to-time converter which is based on the control word for controlling the frequency of the output signal.

3. The method of claim 2, further comprising:
   measuring a phase error of the reference signal with respect to a phase of the output signal generated by the digital-to-time converter based on a second entry in the look-up table, wherein the second entry is assigned to a second control code for the digital-to-time converter for which the digital-to-time converter is phase linear; and
   generating a correction code based on the phase offset, wherein the first control code is further based on the correction code.

4. The method of claim 1, further comprising:
   adjusting a phase of the reference signal to be substantially equal to a phase of the output signal generated by the digital-to-time converter based on a second entry in the look-up table, wherein the second entry is assigned to a second control code for the digital-to-time converter for which the digital-to-time converter is phase linear.

5. The method of claim 4, wherein generating the reference signal is further based on a frequency control word, and wherein adjusting the phase of the reference signal comprises:
   measuring, for the second entry, a third temporal order of a transition of the output signal from the first signal level to the second signal level, and a transition of the reference signal from the first signal level to the second signal level; and
   generating the frequency control word based on the third temporal order.

6. The method of claim 5, wherein adjusting the frequency control word comprises:
   calculating, based on the third temporal order, a phase error of the reference signal with respect to the output signal; and
   adjusting the frequency control word based on the phase error.

7. The method of claim 1, wherein measuring the temporal order comprises measuring a predetermined number of temporal orders, and wherein adjusting the first entry is based on the predetermined number of temporal orders.

8. The method of claim 7, wherein at least part of the predetermined number of temporal orders is measured in parallel.

9. The method of claim 7, wherein adjusting the first entry based on the predetermined number of temporal orders comprises:
   deriving an indicator value from the predetermined number of temporal orders which indicates whether the transition of the output signal from the first signal level to the second signal level, or the transition of the reference signal from the first signal level to the second signal level is leading the other one more often among the predetermined number of temporal orders; and
   adjusting the first entry based on the indicator value.

10. The method of claim 9, wherein the first entry is only adjusted if the absolute value of the indicator value is greater than a threshold value.

11. The method of claim 7, wherein measuring the predetermined number of temporal orders and adjusting the first entry based on the predetermined number of temporal orders is carried out iteratively.

12. The method of claim 11, wherein the digital-to-time converter generates the output signal based on further entries in the look-up table, the further entries being assigned to further control codes for the digital-to-time converter, and wherein the method further comprises:
measuring, for the further entries, a respective temporal order of the transition of the output signal from the first signal level to the second signal level, and the transition of the reference signal from the first signal level to the second signal level; and
adjusting the further entries based on the respective temporal order.

13. The method of claim 12, wherein measuring the respective temporal order for the further entries is carried out a predetermined number of times so that a respective predetermined number of temporal orders is measured for each of the further entries, and wherein adjusting the further entries is based on the respective predetermined number of temporal orders.

14. The method of claim 13, wherein measuring the respective predetermined number of temporal orders for the first and the further entries of the look-up table, and adjusting the first and the further entries is carried out iteratively until a maximum number of iterations is reached or each of the first and the further entries satisfies a quality criterion.

15. The method of claim 11, wherein iteratively adjusting the first entry comprises:
incrementing or decrementing the first entry in the first iteration by a first value based on the predetermined number of temporal orders of the first iteration; and
incrementing or decrementing the first entry in the second iteration by a second value based on the predetermined number of temporal orders of the second iteration, wherein the second value is substantially half of the first value.

16. The method of claim 1, further comprising:
measuring, for the first entry, a second temporal order of a transition of the output signal from the second signal level to the first signal level, and a transition of the reference signal from the second signal level to the first signal level,
wherein adjusting the first entry is further based on the second temporal order.

17. The method of claim 1, wherein adjusting the first entry comprises:
incrementing or decrementing the first entry based on the first temporal order.

18. A system for calibrating a phase nonlinearity of a digital-to-time converter, comprising:
a phase-locked loop configured to generate, based on a control word, a reference signal, wherein a frequency of the reference signal is substantially equal to a frequency of an output signal of the digital-to-time converter;
a detection circuit configured to measure a temporal order of a transition of the output signal from a first signal level to a second signal level, and a transition of the reference signal from the first signal level to the second signal level, wherein the temporal order indicates which of the output signal and the reference signal switches first from the first signal level to the second signal level; and
a processing circuit configured to adjust a first entry of a look-up table based on the measured temporal order.

19. The system of claim 18, wherein the digital-to-time converter generates the output signal based on the first entry of the look-up table, wherein the first entry is assigned to a first control code for the digital-to-time converter which is based on the control word for controlling the frequency of the output signal.

20. The system of claim 18, wherein the phase-locked loop is configured to adjust a phase of the reference signal to be substantially equal to a phase of the output signal generated by the digital-to-time converter based on a second entry in the look-up table, wherein the second entry is assigned to a second control code for the digital-to-time converter for which the digital-to-time converter is phase linear.

21. The system of claim 20, wherein:
the phase-locked loop is further configured to generate the reference signal based on a frequency control word,
the detection circuit is further configured to measure, for the second entry, a third temporal order of a transition of the output signal from the first signal level to the second signal level, and a transition of the reference signal from the first signal level to the second signal level; and
the system further comprises a conversion circuit configured to generate the frequency control word based on the third temporal order.

22. The system of claim 18, wherein the detection circuit is further configured to measure a predetermined number of temporal orders, and wherein the processing circuit is further configured to adjust the first entry based on the predetermined number of temporal orders.

23. The system of claim 22, wherein the processing circuit is further configured to:
derive an indicator value from the predetermined number of temporal orders which indicates whether the transition of the output signal from the first signal level to the second signal level, or the transition of the reference signal from the first signal level to the second signal level is leading the other one more often among the predetermined number of temporal orders; and
adjust the first entry based on the indicator value.

24. The system of claim 23, wherein the processing circuit is further configured to adjust the first entry only if the absolute value of the indicator value is greater than a threshold value.

25. A receiver comprising a digital-to-time converter and a system for calibrating a phase nonlinearity of the digital-to-time converter according to claim 18.

* * * * *